(12) United States Patent
Badger, II et al.

(10) Patent No.: US 11,263,836 B1
(45) Date of Patent: Mar. 1, 2022

(54) CUSTOMIZABLE CHARGE STATUS INDICATOR SYSTEMS

(71) Applicant: FORD GLOBAL TECHNOLOGIES, LLC, Dearborn, MI (US)

(72) Inventors: Charles Everett Badger, II, Westland, MI (US); Ryan Hunt, Royal Oak, MI (US); Brandon Beauvais, Dearborn, MI (US); Ian Lawson, Albany, OH (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 16/993,645

(22) Filed: Aug. 14, 2020

(51) Int. Cl.
| | |
|---|---|
| *G07C 5/08* | (2006.01) |
| *G01R 31/36* | (2020.01) |
| *B60L 53/16* | (2019.01) |
| *F21V 3/06* | (2018.01) |
| *F21V 23/00* | (2015.01) |
| *H02J 7/00* | (2006.01) |
| *F21V 3/02* | (2006.01) |
| *F21Y 113/17* | (2016.01) |
| *F21Y 115/10* | (2016.01) |

(52) U.S. Cl.
CPC ............ *G07C 5/0825* (2013.01); *B60L 53/16* (2019.02); *F21V 3/02* (2013.01); *F21V 3/062* (2018.02); *F21V 23/003* (2013.01); *G01R 31/3646* (2019.01); *G07C 5/0833* (2013.01); *H02J 7/0045* (2013.01); *H02J 7/0048* (2020.01); *F21Y 2113/17* (2016.08); *F21Y 2115/10* (2016.08)

(58) Field of Classification Search
CPC ..... G07C 5/0825; G07C 5/0833; F21V 3/062; F21V 3/02; F21V 23/003; G01R 31/3646; B60L 53/16; H02J 7/0048; H02J 7/0045; F21Y 2113/17; F21Y 2115/10
See application file for complete search history.

(56) References Cited

U.S. PATENT DOCUMENTS

| | | | |
|---|---|---|---|
| 9,545,853 B1* | 1/2017 | Penilla | ................... B60L 53/31 |
| 10,124,725 B2 | 11/2018 | Lovett et al. | |
| 10,576,969 B2 | 3/2020 | Penilla et al. | |
| 2011/0043355 A1* | 2/2011 | Chander | ............... B60K 15/05 |
| | | | 340/455 |
| 2012/0133282 A1* | 5/2012 | Rubio | ..................... B60Q 1/50 |
| | | | 315/77 |
| 2015/0022994 A1 | 1/2015 | Bingle | |
| 2017/0240060 A1* | 8/2017 | Roberts | ............... B60Q 1/2661 |

\* cited by examiner

*Primary Examiner* — Bao Q Truong
(74) *Attorney, Agent, or Firm* — David B. Kelley; Carlson, Gaskey & Olds, P.C.

(57) ABSTRACT

This disclosure is directed to customizable charge status indicator systems for electrified vehicle charge port assemblies. Exemplary charge status indicator systems may include a charge port lighting module, and a human machine interface (HMI) that includes various user interfaces configured for receiving inputs for customizing different lighting effects that can be emitted by the charge port lighting module. The charge status indicator systems may further include a controller operably coupled to both the charge port lighting module and the HMI and configured for commanding the charge port lighting module to emit customized lighting effects in response to receiving input signals from the HMI.

20 Claims, 6 Drawing Sheets

CUSTOMIZABLE CHARGE STATUS INDICATOR SYSTEMS

TECHNICAL FIELD

This disclosure relates to electrified vehicles, and more particularly to customizable charge status indicator systems for electrified vehicle charge port assemblies.

BACKGROUND

Electrified vehicles differ from conventional motor vehicles because they are selectively driven by one or more traction battery pack powered electric machines. The electric machines can propel the electrified vehicles instead of, or in combination with, an internal combustion engine. Some electrified vehicles, such as plug-in hybrid electric vehicles (PHEVs) and battery electric vehicles (BEVs), include a charge port that is connectable to a charger for charging the traction battery pack. The charge port may include an indicator for indicating a charge status.

SUMMARY

A charge status indicator system according to an exemplary aspect of the present disclosure includes, among other things, a charge port lighting module and a human machine interface (HMI) that includes a user interface configured to receive an input of a customized lighting effect of the charge port lighting module.

In a further non-limiting embodiment of the forgoing charge status indicator system, the charge port lighting module includes one or more plastic indicator lenses, one or more light sources, and a printed circuit board (PCB).

In a further non-limiting embodiment of either of the foregoing charge status indicator systems, the one or more plastic indicator lenses establishes an indicator ring.

In a further non-limiting embodiment of any of the foregoing charge status indicator systems, the one or more light sources is a multi-colored light emitting diode (LED).

In a further non-limiting embodiment of any of the foregoing charge status indicator systems, the customized lighting effect includes a custom color.

In a further non-limiting embodiment of any of the foregoing charge status indicator systems, the customized lighting effect includes a custom pattern.

In a further non-limiting embodiment of any of the foregoing charge status indicator systems, the customized lighting effect includes a lighting effect that is synchronized to an audio file.

In a further non-limiting embodiment of any of the foregoing charge status indicator systems, the customized lighting effect is a night vision mode lighting effect.

In a further non-limiting embodiment of any of the foregoing charge status indicator systems, the user interface includes a touch screen toggle or drop down menu.

In a further non-limiting embodiment of any of the foregoing charge status indicator systems, the HMI includes a second user interface configured to receive a second input of a second customized lighting effect of the charge port lighting module, and a third user interface configured to receive a third input of a third customized lighting effect of the charge port lighting module.

In a further non-limiting embodiment of any of the foregoing charge status indicator systems, a controller is configured to command the charge port lighting module to emit the customized lighting effect in response to receiving an input signal from the HMI.

In a further non-limiting embodiment of any of the foregoing charge status indicator systems, the controller is a local interconnect network (LIN) microcontroller operably connected to the HMI and a printed circuit board (PCB) of the charge port lighting module.

An electrified vehicle according to another exemplary aspect of the present disclosure includes, among other things, a charge port assembly including a port and a charge status indicator system including a lighting module located near the port, a human machine interface (HMI), and a controller operably connected to each of the lighting module and the HMI. The HMI is configured to receive a plurality of inputs for customizing various lighting effects emitted from the lighting module.

In a further non-limiting embodiment of the foregoing electrified vehicle, the controller is configured to control the lighting module to emit customized lighting effects in response to receiving an input signal from the HMI.

In a further non-limiting embodiment of either of the foregoing electrified vehicles, the lighting module includes an indicator ring that circumscribes the port.

In a further non-limiting embodiment of any of the foregoing electrified vehicles, the lighting module includes an indicator ring that circumscribes a charger unlock button that is located adjacent to the port.

In a further non-limiting embodiment of any of the foregoing electrified vehicles, the plurality of inputs include a first input related to a lighting effect color and a second input related to a lighting effect pattern.

In a further non-limiting embodiment of any of the foregoing electrified vehicles, the plurality of inputs include a third input related to a lighting effect synchronized to an audio file.

In a further non-limiting embodiment of any of the foregoing electrified vehicles, the plurality of inputs includes a fourth input related to a night vision mode of the lighting module.

In a further non-limiting embodiment of any of the foregoing electrified vehicles, the lighting module includes one or more plastic indicator lenses, one or more light sources, and a printed circuit board (PCB).

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure describes customizable charge status indicator systems for electrified vehicle charge port assemblies. Exemplary charge status indicator systems may include a charge port lighting module, and a human machine interface (HMI) that includes various user interfaces configured for receiving inputs for customizing different lighting effects that can be emitted by the charge port lighting module. The charge status indicator systems may further include a controller operably coupled to both the charge port lighting module and the HMI and configured for commanding the charge port lighting module to emit customized lighting effects in response to receiving input signals from the HMI. These and other features of this disclosure are discussed in greater detail in the following paragraphs of this detailed description.

Figure 1:
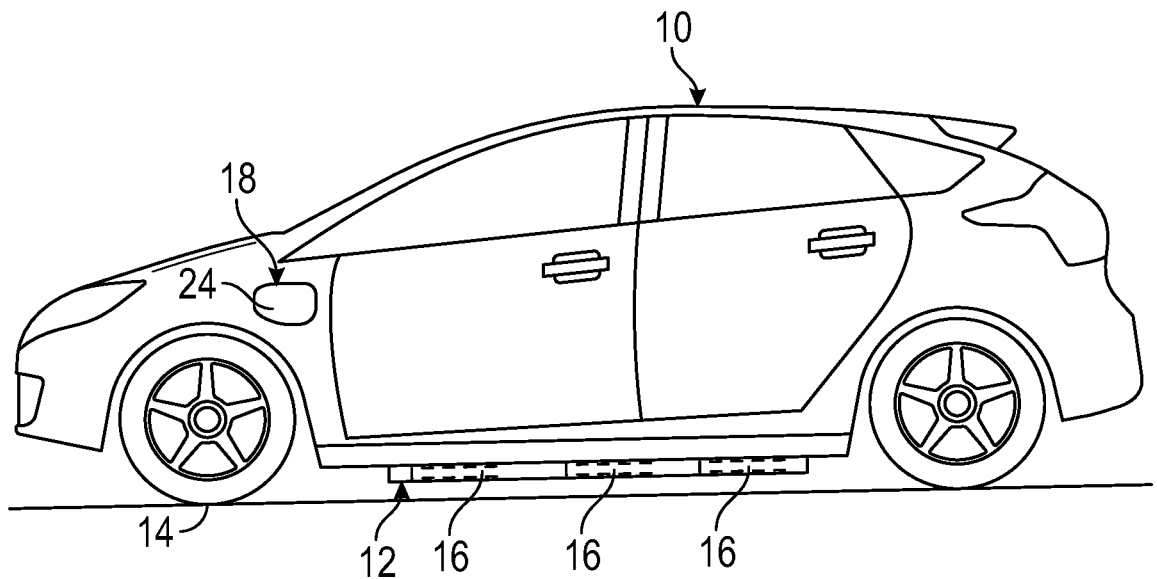
FIG. 1 is a side view of an electrified vehicle equipped with a charge port assembly.
Figure 2:
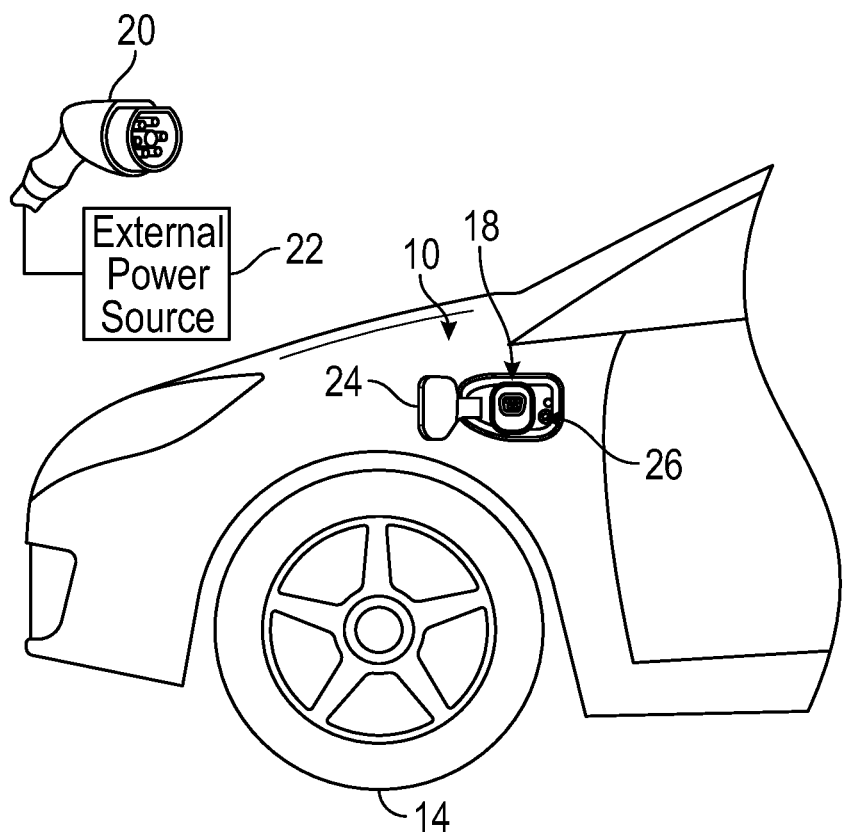
FIG. 2 is a blown-up view of the charge port assembly of the electrified vehicle of FIG. 1.

FIGS. 1 and 2 illustrate an exemplary electrified vehicle 10 that includes a traction battery pack 12. The electrified vehicle 10 may include any electrified powertrain capable of applying a torque from an electric machine for driving drive wheels 14 of the electrified vehicle 10. In an embodiment, the electrified vehicle 10 is a plug-in hybrid electric vehicle (PHEV). In another embodiment, the electrified vehicle is a battery electric vehicle (BEV). Therefore, the powertrain may electrically propel the drive wheels 14 either with or without the assistance of an internal combustion engine.

The electrified vehicle 10 of FIGS. 1-2 is schematically illustrated as a car. However, the teachings of this disclosure may be applicable to any type of vehicle, including but not limited to, cars, trucks, vans, sport utility vehicles (SUVs), etc.

Although shown schematically, the traction battery pack 12 may be a high voltage traction battery pack that includes a plurality of battery arrays 16 (i.e., battery assemblies or groupings of battery cells) capable of outputting electrical power to one or more electric machines of the electrified vehicle 10. Other types of energy storage devices and/or output devices can also be used to electrically power the electrified vehicle 10.

From time to time, charging the traction battery pack 12 may be required or desirable. The electrified vehicle 10 may therefore be equipped with a charge port assembly 18 (sometimes referred to as a vehicle inlet assembly) for charging the energy storage devices (e.g., battery cells) of the traction battery pack 12. A charger 20 (sometimes referred to as electric vehicle supply equipment (EVSE)) can be coupled to the charge port assembly 18 to charge the traction battery pack 12 of the electrified vehicle 10 from an external power source 22. In an embodiment, the external power source 22 includes utility grid power. In another embodiment, the external power source 22 includes an alternative energy source, such as solar power, wind power, etc. In yet another embodiment, the external power source 22 includes a combination of utility grid power and alternative energy sources. The external power source 22 may be located at a home of the user, a public charging station, etc.

The charge port assembly 18 may include a charge port door 24 that is closed during typical operation of the electrified vehicle 10. When charging the electrified vehicle 10 from the external power source 22 is desired, the charge port door 24 can move from the closed position shown in FIG. 1 to the open position shown in FIG. 2. A user can then couple the charger 20 to the charge port assembly 18 so that power from the external power source 22 can be provided to the traction battery pack 12 of the electrified vehicle 10 for charging the battery cells contained therein.

The exemplary charge port assembly 18 may include one or more ports configured to receive AC power from the external power source 22. In another embodiment, the charge port assembly 18 includes one or more ports configured to receive DC power from the external power source 22. In yet another example, the charge port assembly includes a combined AC/DC charge port that is configured to receive AC power, DC power, or both from the external power source 22. The charger 20 may thus be configured to provide any level of charging (e.g., level 1, level 2, DC, etc.).

The charge port assembly 18 may additionally be equipped with a charge status indicator system 26 for conveying various charging-related information to a user when the charger 20 is coupled to the charge port assembly 18. The user may desire to customize certain settings associated with the charge status indicator system 26. This disclosure therefore describes customizable charge status indicator systems 26 that can be customized to suit a user's own personal styling preferences.

Figure 3:
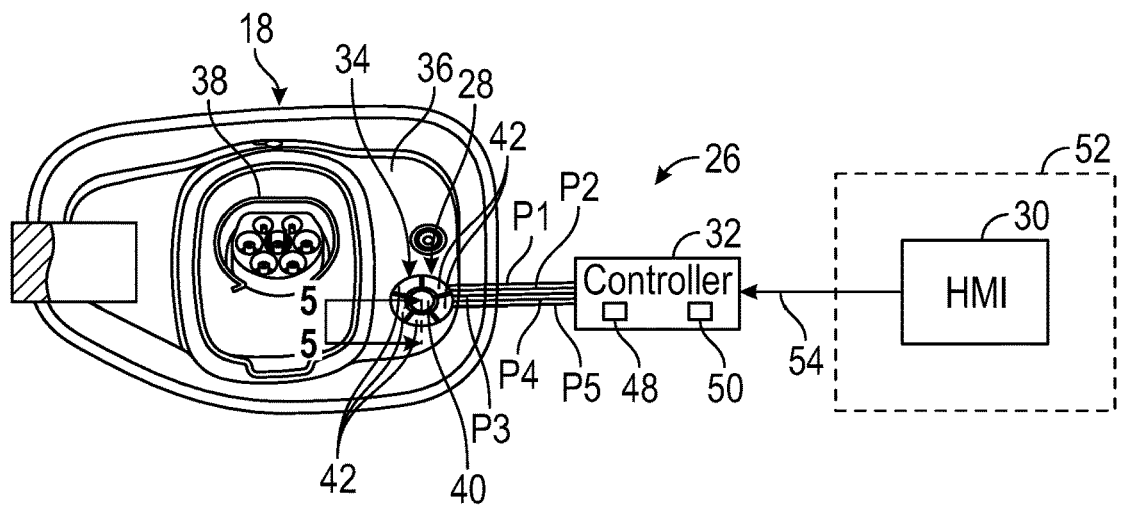
FIG. 3 schematically illustrates an exemplary charge status indicator system of a vehicle charge port assembly.

Referring to FIG. 3, with continued reference to FIGS. 1 and 2, an exemplary charge status indicator system 26 of a charge port assembly 18 may include a lighting module 28, a human machine interface (HMI) 30, and a controller 32 that is operably coupled to each of the lighting module 28 and the HMI 30. As further detailed below, the controller 32 may receive various inputs (e.g., signals) from the HMI 30 for customizing various aspects of the visually distinctive lighting effects that can be emitted by the lighting module 28 in order to convey various charging-related information (e.g., charging level, charging type, charging faults, charging complete, etc.) to a user. The various lighting effects of the lighting module 28 may be customized in terms of color, pattern, brightness, speed of illumination, length of illumination, etc.

The specific configuration of the lighting module 28 is not intended to limit this disclosure, however, in an exemplary embodiment, the lighting module 28 may include an indicator ring 34 supported relative to a housing 36 of the charge port assembly 18. In an embodiment, the indicator ring 34 is positioned adjacent to a port 38 of the charge port assembly 18 and extends circumferentially about a perimeter of a charger unlock button 40 (see FIG. 3), which can be pressed by an authorized user to unlock the charger 20 from the port 38. In another embodiment, the indicator ring 34 is distributed circumferentially about a periphery of the port 38 of the charge port assembly 18 (see FIG. 5).

Figure 4:
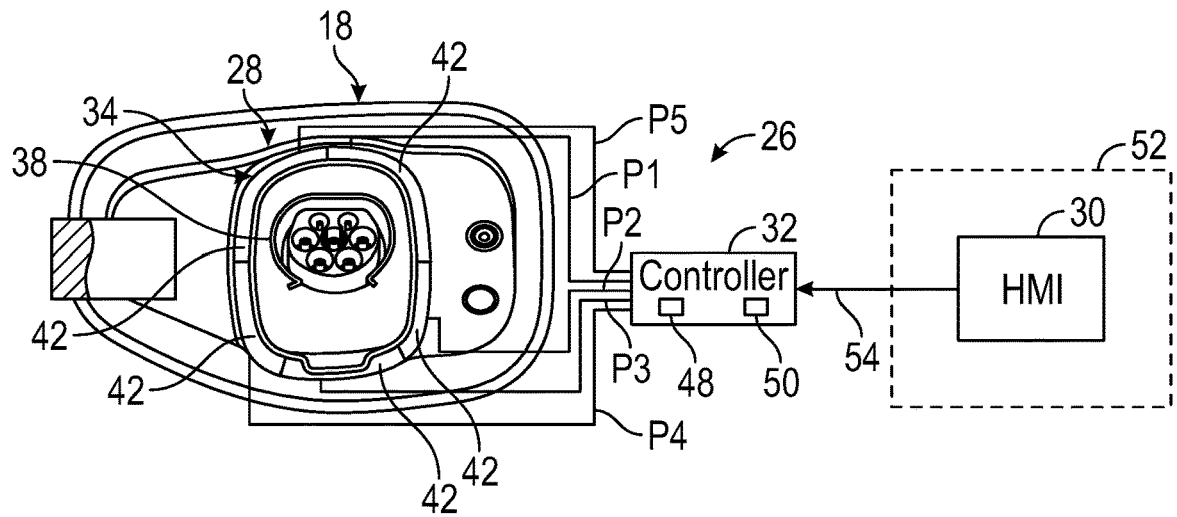
FIG. 4 schematically illustrates another exemplary charge status indicator system of a vehicle charge port assembly.
Figure 5:
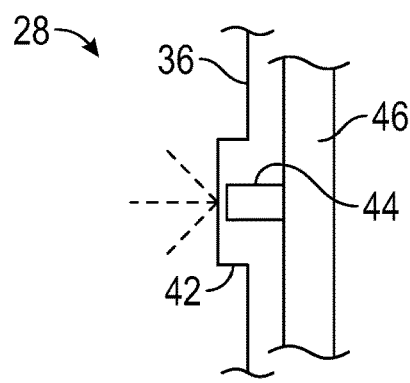
FIG. 5 is a cross-sectional view through a section of an indicator ring of a charge status indicator system.

As best shown in FIGS. 3, 4, and 5, the lighting module 28 may include one or more plastic indicator lenses 42, one or more light sources 44, and a printed circuit board (PCB) 46. The plastic indicator lenses 42 may be arranged relative to one another to establish the indicator ring 34. The plastic indicator lenses 42 may be light permeable to allow light L from the light sources 44 to escape from the inside to the outside of the lighting module 28 for conveying various charging-related information to the user.

Each light source 44 may be a light emitting diode (LED). In an embodiment, each light source 44 is a multi-colored LED, such as a Red, Green, Blue (RGB) LED, for example. Other light sources could also be utilized within the scope of this disclosure. The light sources 44 may be arranged on the PCB 46, which may be disposed inside the housing 36 of the charge port assembly 18. The PCB 46 of lighting module 28 may be operably connected to the controller 32 and includes control circuitry including LED driver circuitry for controlling activation and deactivation of the light sources 44 in response to commands from the controller 32.

The total numbers of the plastic indicator lenses 42 and the light sources 44 provided within the lighting module 28 may vary and is design dependent. In an embodiment, the lighting module 28 includes a sufficient number of light sources 44 for allowing users to visualize the combination of lighting effects emitted therefrom during both daytime conditions and nighttime conditions.

The controller 32 can selectively activate each light source 44 of the lighting module 28 to cause the light sources 44 to emit light through the plastic indicator lenses 42 for conveying charging-related information to the user. For example, in an embodiment, the number of plastic indicator lenses 42 illuminated by the controller 32 can correspond generally to a state of charge (SOC) of the traction battery pack 12. In an embodiment, the indicator ring 34 of the lighting module 28 includes five plastic indicator lenses 42. If the state of charge of the traction battery pack 12 of the electrified vehicle 10 is approximately 40%, the controller 32 activates light sources 44 associated with two of the five plastic indicator lenses 42, or 40% of the plastic indicator lenses 42. The user observing the indicator ring 34 would understand that, because two of the five plastic indicator lenses 42 are illuminated, the SOC of the traction battery pack 12 is approximately 40%.

In an embodiment, the controller 32 is a local interconnect network (LIN) microcontroller. LIN is a communication protocol utilized to communicate between components of vehicles. The LIN protocol can communicate utilizing LIN messages (signals). In the exemplary embodiment, the controller 32 can transmit a LIN message along paths P1-P5 to activate or deactivate the light sources 44 associated with each of the plastic indicator lenses 42.

The controller 32 may include a processing unit 48 and non-transitory memory 50 for executing the various control strategies of the charge status indicator system 26. The processing unit 48 can be programmed to execute one or more programs stored in the memory 50. The program may be stored in the memory 50 as software code, for example. The program stored in the memory 50 may include one or more additional or separate programs, each of which includes an ordered list of executable instructions for implementing logical functions associated with the charge status indicator system 26.

The processing unit 48 can be a custom made or commercially available processor, a central processing unit (CPU), or generally any device for executing software instructions. The memory 50 can include any one or combination of volatile memory elements and/or nonvolatile memory elements.

The HMI 30 may be provided within a passenger cabin 52 of the electrified vehicle 10. The HMI 30 may include various user interfaces for displaying information to the vehicle user and for allowing the vehicle user to enter information into the HMI 30. The user may interact with the user interfaces via various touch screens, tactile buttons, audible speech, speech synthesis, etc., or any combination of such input devices.

In an embodiment, the HMI 30 enables the user to customize various settings associated with the charge status indicator system 26. For example, the user may customize, via the HMI 30, features such as color, pattern, brightness, speed of illumination, length of illumination, etc. of the various lighting effects that can be emitted by the lighting module 28 of the charge status indicator system 26. When the user has customized a particular setting associated with the charge status indicator system 26 using the HMI 30, the HMI 30 may communicate a input signal 54 to the controller 32. In response to receiving the input signal 54, the controller 32 may subsequently command the lighting module 28 to apply a custom color, pattern, etc. to be emitted from the indicator ring 34 during a subsequent charging event (e.g., when the charger 20 is next plugged into the port 38 of the charge port assembly 18). Each light source 44 of the lighting module 28 of the charge status indicator system 26 can be selectively controlled, either individually or in units, to generate the requested customized color, pattern, etc. to be emitted by the lighting module 28.

Figure 6:
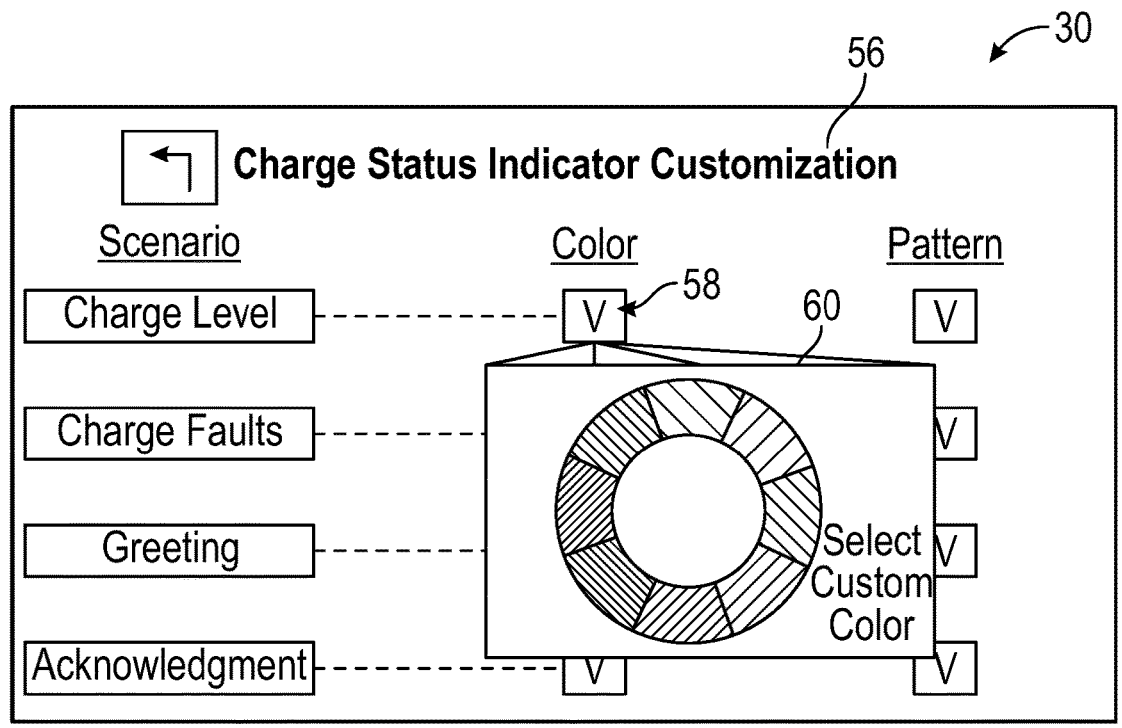
FIG. 6 illustrates an exemplary user interface of a human machine interface. The user interface can be used to customize a setting associated with a charge status indicator system for a vehicle charge port assembly.

A first exemplary user interface 56 configured for allowing the user to select and apply a customized color setting associated with the charge status indicator system 26 using the HMI 30 is schematically illustrated in FIG. 6. The user interface 56 may include a touch screen drop down menu 58, or some other input device, that can be actuated in order to present a myriad of custom color options 60 that the user can select for emitting a customized color from the lighting module 28 during various aspects or scenarios that may arise during a given charging event. The custom color options 60 may be presented as a color palate wheel, a plurality of individual color tiles, or in various other manners.

Using the user interface 56, the user may select a customized color that is emitted from the lighting module 28 for indicating various different aspects or scenarios of a given charging event, including but not limited to, the charge level of the traction battery pack 12, the charging type (e.g., preconditioning versus regular charging), charging faults, opening of the charge port door 24 (e.g., a greeting sequence), correct/incorrect connection between the charger 20 and the port 38 (e.g., an acknowledgment sequence), charge pending, charge complete, etc.

The total number of the colors included as part of the custom color options 60 presented by the user interface 56 is not intended to limit this disclosure. In addition, although shown as including a drop down menu 58, the user interface 56 could employ various other input devices, such as toggles, sliding scales, or any other features or combinations of features that would allow the user to select and apply a customized color for each scenario that may arise during a charging event.

Figure 7:
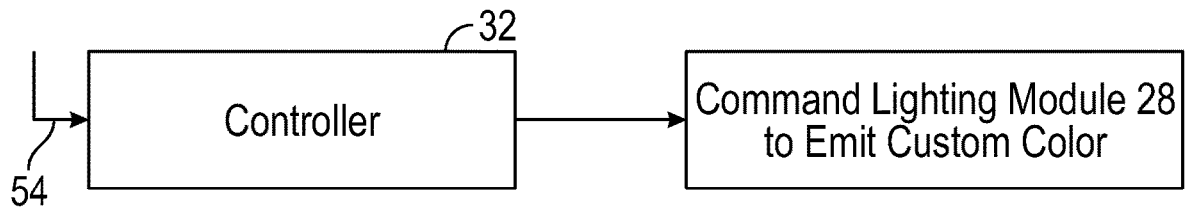
FIG. 7 schematically illustrates a control strategy for controlling a lighting module of a charge status indicator system in response to receiving an input of the customized setting entered into the user interface of FIG. 6.

In response to receiving the input signal 54 from the HMI 30 indicating that the user has selected a customized color via the user interface 56, the controller 32 may command the lighting module 28 to emit the custom color for indicating a given aspect of charging during a subsequent charging event (shown schematically in FIG. 7).

Figure 8:
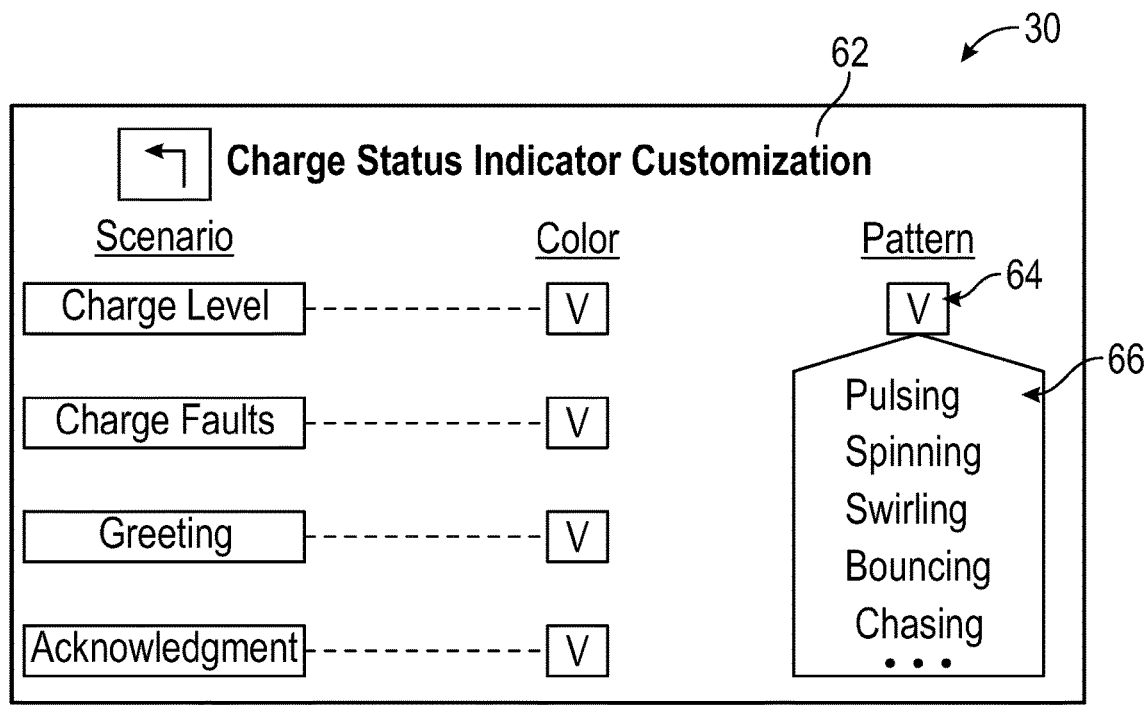
FIG. 8 illustrates another exemplary user interface of a human machine interface. The user interface can be used to customize an additional setting associated with a charge status indicator system for a vehicle charge port assembly.

A second exemplary user interface 62 configured for allowing a user to select a customized pattern setting associated with the charge status indicator system 26 using the HMI 30 is schematically illustrated by FIG. 8. The user interface 62 may include a touch screen drop down menu 64, or some other input device, that presents a listing of custom pattern options 66 that the user can select for emitting a customized lighting effect from the lighting module 28 during various aspects or scenarios associated with a given charging event. The custom pattern options 66 may be presented as a scroll down list or in any other manner and could include, but is not limited to patterns such as pulsing patterns, spinning patterns, swirling patterns, bouncing patterns, chasing patterns, etc. As part of the custom pattern options 66, the user may also customize the speed and/or brightness of the lighting effect. By way of one non-limiting example, the user could select a pattern that pulses at different speeds to indicate the level of charge of the traction battery pack 12.

The total number of the patterns included as part of the custom pattern options 66 presented by the user interface 62 is not intended to limit this disclosure. In addition, although shown as including a drop down menu 64, the user interface 62 could employ various other input devices, such as toggles, sliding scales, or any other features or combinations of features that would allow the user to select and apply a customized pattern for each potential aspect of a charging event.

Figure 9:
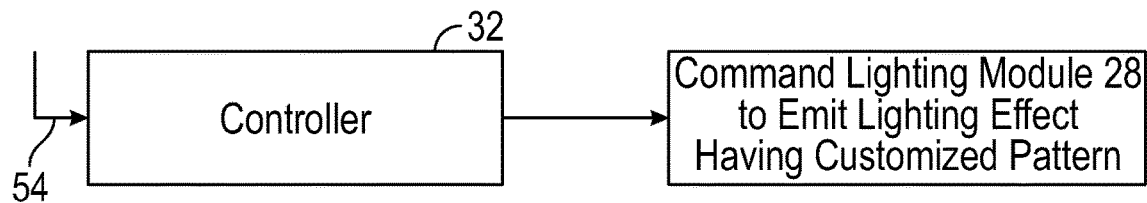
FIG. 9 schematically illustrates a control strategy for controlling a lighting module of a charge status indicator system in response to receiving an input of the customized setting entered into the user interface of FIG. 8.

Using the user interface 62, the user may select a customized pattern associated with a lighting effect that is emitted from the lighting module 28 for indicating various different aspects or scenarios of a given charging event, including but not limited to, the charging level, the charging type (e.g., preconditioning versus regular charging), charging faults, opening of the charge port door 24 (e.g., a greeting sequence), correct/incorrect connection between the charger 20 and the port 38 (e.g., an acknowledgment sequence), charging pending, charging complete, etc. In response to receiving the input signal 54 from the HMI 30 indicating that the user has selected a customized pattern via the user interface 62, the controller 32 may command the lighting module 28 to emit a lighting effect that exhibits the characteristics of the custom pattern for indicating a given aspect of charging during a subsequent charging event (shown schematically in FIG. 9).

Figure 10:
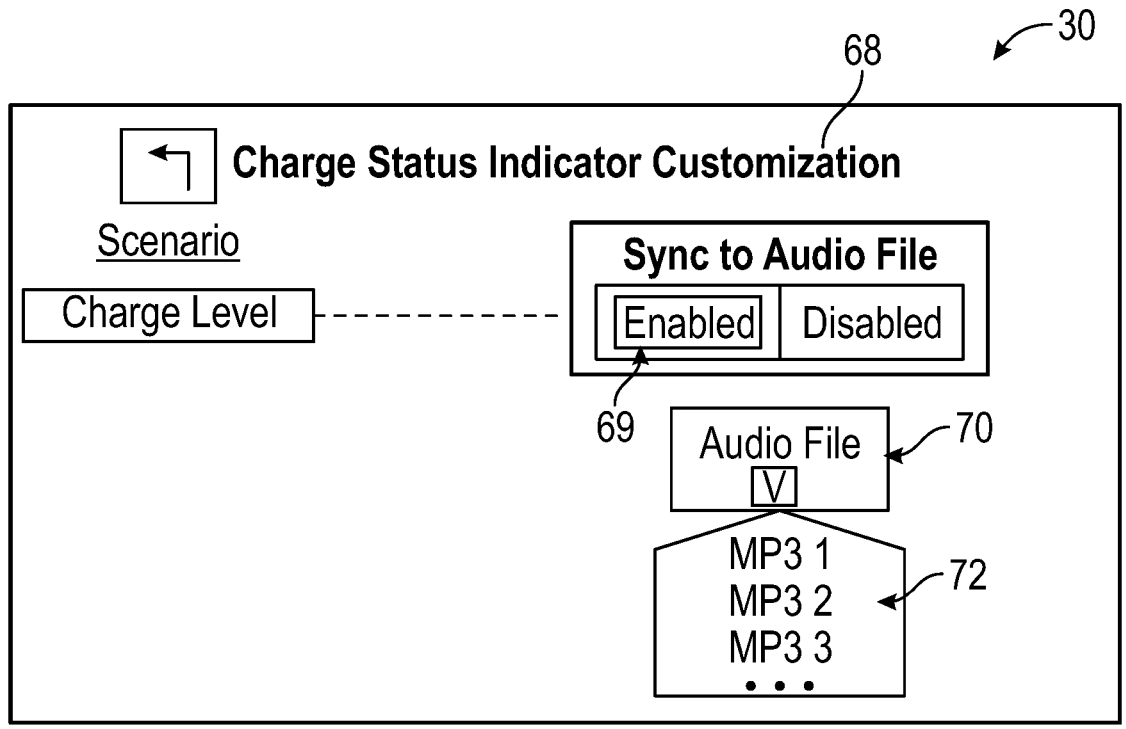
FIG. 10 illustrates another exemplary user interface of a human machine interface. The user interface can be used to customize an additional setting associated with a charge status indicator system for a vehicle charge port assembly.
Figure 11:
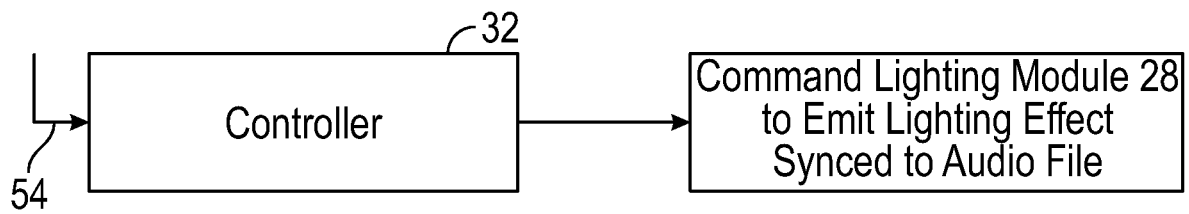
FIG. 11 schematically illustrates a control strategy for controlling a lighting module of a charge status indicator system in response to receiving an input of the customized setting entered into the user interface of FIG. 10.

A third exemplary user interface 68 configured for allowing the user to synchronize a lighting effect of the charge status indicator system 26 to an audio file using the HMI 30 is schematically illustrated in FIG. 10. The user interface 68 may include a toggle 69 for enabling the synchronization to an audio file and a touch screen drop down menu 70, or some other input device, that presents a listing of audio files 72, such as music files or other media, that the user can select for synchronizing a given lighting effect of the lighting module 28 to audio during various aspects or scenarios of a given charging event. The audio files 72 may be files stored within a memory device of the HMI 30 or within a personal electronic device (e.g., a cell phone) of the user that is paired or otherwise synched to the HMI 30.

Using the user interface 68, the user may select a customized audio file that is played when a given lighting effect is being emitted from the lighting module 28. The lighting effect and associated audio file may be assigned to various different aspects of a given charging event, including but not limited to, the charge level, the charging type (e.g., preconditioning versus regular charging), charging faults, opening of the charge port door 24 (e.g., a greeting sequence), correct/incorrect connection between the charger 20 and the port 38 (e.g., an acknowledgment sequence), charging pending, charging complete, etc.

Although shown as including a drop down menu 70, the user interface 68 could employ various other input devices, such as toggles, sliding scales, or any other features or combinations of features that would allow the user to select and apply a customized audio file to be played in concert with a lighting effect during various aspects of a charging event.

Figure 12:
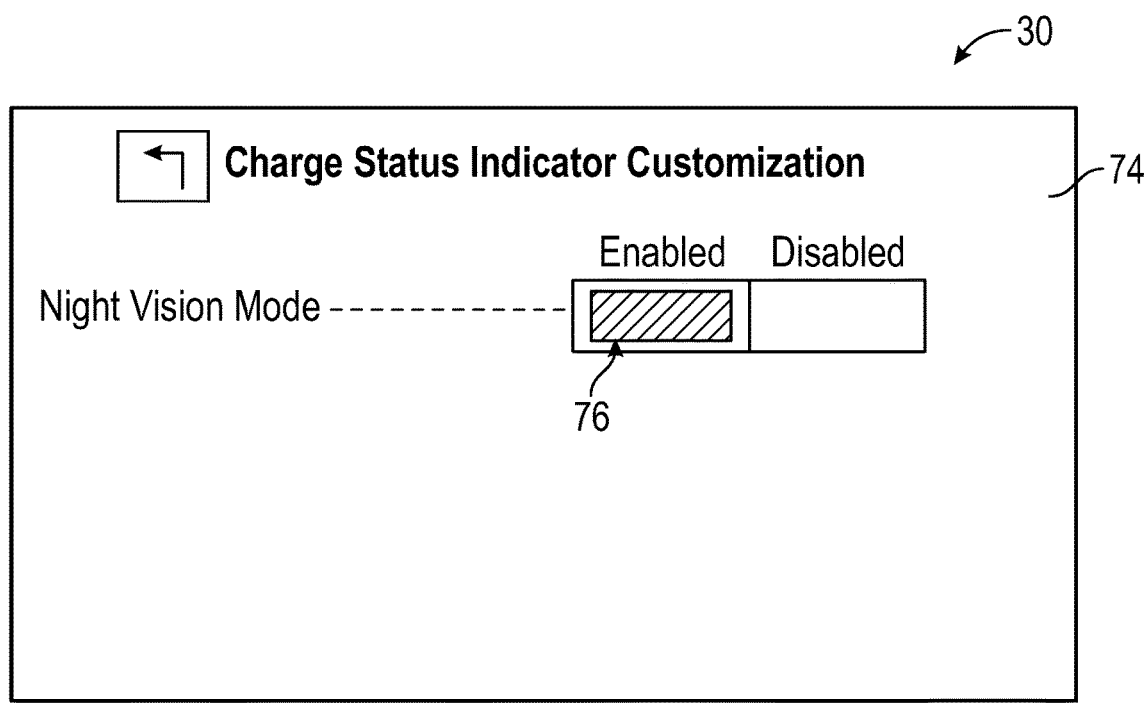
FIG. 12 illustrates another exemplary user interface of a human machine interface. The user interface can be used to customize an additional setting associated with a charge status indicator system for a vehicle charge port assembly.

In response to receiving the input signal 54 from the HMI 30 indicating that the user has selected a customized audio file to accompany a given lighting effect via the user interface 68, the controller 32 may command the lighting module 28 to emit the lighting effect and may simultaneously command the vehicle infotainment system to play the audio file for indicating a given aspect of charging during a subsequent charging event (shown schematically in FIG. 12). In an embodiment, the selected audio file may be played through the speakers of the vehicle infotainment system of the electrified vehicle 10.

Figure 13:
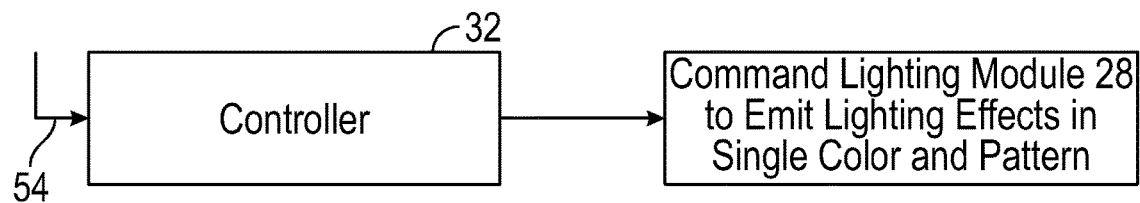
FIG. 13 schematically illustrates a control strategy for controlling a lighting module of a charge status indicator system in response to receiving an input of the customized setting entered into the user interface of FIG. 12.

A fourth exemplary user interface 74 configured for allowing the user to select a night vision mode of the charge status indicator system 26 using the HMI 30 is schematically illustrated in FIG. 13. During night vision mode, the lighting module 28 may be commanded to emit a single color (e.g., green or red) and pattern (e.g., solid or non-strobing) of light, such as to avoid disturbing light sensitive humans or other animals.

The user interface 74 may include a toggle 76 that allows the user to either enable or disable the night vision mode. Although shown as including toggles, the user interface 74 could employ drop down menus, sliding scales, or any other features or combinations of features that would allow the user to enable or disable the night vision mode.

In response to receiving the input signal 54 from the HMI 30 indicating that the user has selected a night vision mode at the user interface 74, the controller 32 may command the lighting module 28 to emit lighting effects in a single, solid color and pattern during subsequent charging events (shown schematically in FIG. 14).

Although described separately above, any of the various user interfaces of the HMI 30 could be combined. For example, both the color customization and the pattern customization could be part of a single user interface of the HMI 30 within the scope of this disclosure.

The charge status indicator systems of this disclosure allow for customization of plug-in electric vehicles, which is a desire of many plug-in vehicle customers. The ability to customize the lighting effects of the charge status indicator system may be particularly beneficial to customers who dislike the default charge status colors/pattern settings selected by the manufacturer.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A charge status indicator system, comprising:
   a charge port lighting module; and
   a human machine interface (HMI) that includes a user interface configured to receive user input of a customized lighting effect of the charge port lighting module,
   wherein the customized lighting effect includes a user-selected custom color or a user-selected custom pattern.

2. The charge status indicator system as recited in claim 1, wherein the charge port lighting module includes one or more plastic indicator lenses, one or more light sources, and a printed circuit board (PCB).

3. The charge status indicator system as recited in claim 2, wherein the one or more plastic indicator lenses establishes an indicator ring.

4. The charge status indicator system as recited in claim 2, wherein the one or more light sources is a multi-colored light emitting diode (LED).

5. The charge status indicator system as recited in claim 1, wherein the customized lighting effect includes the user-selected custom color.

6. The charge status indicator system as recited in claim 1, wherein the customized lighting effect includes the user-selected custom pattern.

7. The charge status indicator system as recited in claim 1, wherein the customized lighting effect includes a lighting effect that is synchronized to an audio file.

8. The charge status indicator system as recited in claim 1, wherein the customized lighting effect is a night vision mode lighting effect.

9. The charge status indicator system as recited in claim 1, wherein the user interface includes a touch screen toggle or drop down menu.

10. The charge status indicator system as recited in claim 1, wherein the HMI includes a second user interface configured to receive a second input of a second customized lighting effect of the charge port lighting module and a third user interface configured to receive a third input of a third customized lighting effect of the charge port lighting module.

11. The charge status indicator system as recited in claim 1, comprising a controller configured to command the charge port lighting module to emit the customized lighting effect in response to receiving an input signal from the HMI.

12. The charge status indicator system as recited in claim 11, wherein the controller is a local interconnect network (LIN) microcontroller operably connected to the HMI and a printed circuit board (PCB) of the charge port lighting module.

13. An electrified vehicle, comprising:
    a charge port assembly including a port; and
    a charge status indicator system including a lighting module located near the port, a human machine interface (HMI), and a controller operably connected to each of the lighting module and the human machine interface,
    wherein the HMI is configured to receive a plurality of user inputs for customizing various lighting effects emitted from the lighting module,
    wherein the plurality of user inputs include a first input related to a user-selected custom lighting effect color and a second input related to user-selected custom lighting effect pattern.

14. The electrified vehicle as recited in claim 13, wherein the controller is configured to control the lighting module to emit customized lighting effects in response to receiving an input signal from the HMI.

15. The electrified vehicle as recited in claim 13, wherein the lighting module includes an indicator ring that circumscribes the port.

16. An electrified vehicle, comprising:
    a charge port assembly including a port; and
    a charge status indicator system including a lighting module located near the port, a human machine interface (HMI), and a controller operably connected to each of the lighting module and the human machine interface,
    wherein the HMI is configured to receive a plurality of inputs for customizing various lighting effects emitted from the lighting module,
    wherein the lighting module includes an indicator ring that circumscribes a charger unlock button that is located adjacent to the port.

17. The electrified vehicle as recited in claim 13, wherein the plurality of inputs include a third input related to a lighting effect synchronized to an audio file.

18. The electrified vehicle as recited in claim 17, wherein the plurality of inputs includes a fourth input related to a night vision mode of the lighting module.

19. The electrified vehicle as recited in claim 13, wherein the lighting module includes one or more plastic indicator lenses, one or more light sources, and a printed circuit board (PCB).

20. The charge status indicator system as recited in claim 1, wherein the user interface includes a color palate wheel or tile that is configured to present a plurality of custom color options that are selectable for providing the customized lighting effect.

* * * * *